(12) United States Patent
Jackson et al.

(10) Patent No.: US 9,036,350 B2
(45) Date of Patent: May 19, 2015

(54) BARRIER DEVICE

(71) Applicant: Control Techniques Ltd, Newtown (GB)

(72) Inventors: Roger Neil Jackson, Launceston (GB); Rhys Marc Owen, Llanwnog (GB); Gareth Huw Jones, Newtown (GB)

(73) Assignee: CONTROL TECHNIQUES LTD, Newtown (GB)

( * ) Notice: Subject to any disclaimer, the term of this patent is extended or adjusted under 35 U.S.C. 154(b) by 151 days.

(21) Appl. No.: 13/648,769

(22) Filed: Oct. 10, 2012

(65) Prior Publication Data

US 2013/0088834 A1        Apr. 11, 2013

(30) Foreign Application Priority Data

Oct. 10, 2011    (GB) .................................. 1117481.0

(51) Int. Cl.
*H05K 7/20*    (2006.01)
*H05K 5/02*    (2006.01)
(Continued)

(52) U.S. Cl.
CPC .......... *H05K 5/0217* (2013.01); *G06F 17/5068* (2013.01); *H05K 7/20009* (2013.01); *H05K 7/20* (2013.01); *H05K 7/20436* (2013.01); *H05K 7/20145* (2013.01); *H05K 7/20154* (2013.01); *H05K 7/20918* (2013.01); *H05K 5/0213* (2013.01); *H05K 7/00* (2013.01)

(58) Field of Classification Search
CPC .................. G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/0086–5/06; H05K 5/069; H05K 7/005–7/08; H05K 7/20; H05K 7/00; H05K 7/1422; H05K 1/0218–1/0219; H05K 1/00; H05K 3/00; H05K 9/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00
USPC ....................... 361/679.46–679.54, 695, 697, 361/688–723, 752–753, 816–818; 165/80.2–80.3; 174/15.1, 16.1–16.3
See application file for complete search history.

(56) References Cited

U.S. PATENT DOCUMENTS 6,058,025 A *    5/2000    Ecker et al. ................... 361/816
6,169,662 B1 *    1/2001    Clark et al. ................... 361/754
(Continued)

FOREIGN PATENT DOCUMENTS

GB          2347020        8/2000
JP          2004-71615     3/2004
JP          2008-21855     1/2008

*Primary Examiner* — Michail V Datskovskiy
*Assistant Examiner* — Razmeen Gafur
(74) *Attorney, Agent, or Firm* — Harness, Dickey & Pierce, P.L.C.

(57) ABSTRACT

This disclosure relates to an apparatus and method 10 for protecting an electronic circuit from an airflow. The apparatus 10 comprises a base 12, wherein said base 12 comprises a cover means for covering at least part of the electronic circuit. The apparatus further comprises a guide means for guiding an airflow around the electronic circuit.

20 Claims, 2 Drawing Sheets

(51) Int. Cl.
   *G06F 17/50*   (2006.01)
   *H05K 7/00*    (2006.01)
   *H01L 23/473*  (2006.01)

(56) References Cited

U.S. PATENT DOCUMENTS

| | | | |
|---|---|---|---|
| 6,330,156 B1* | 12/2001 | Cresse | 361/695 |
| 6,822,874 B1* | 11/2004 | Marler | 361/752 |
| 7,054,164 B2* | 5/2006 | Shih-Tsung | 361/801 |
| 7,817,432 B2* | 10/2010 | Belady et al. | 361/727 |
| 8,077,458 B2* | 12/2011 | Guan | 361/695 |
| 2004/0052061 A1* | 3/2004 | Matsuno et al. | 361/752 |
| 2004/0246662 A1* | 12/2004 | Thurk et al. | 361/631 |
| 2005/0041409 A1* | 2/2005 | Liao | 361/816 |
| 2005/0201065 A1* | 9/2005 | Regnier et al. | 361/720 |
| 2007/0064387 A1 | 3/2007 | Matsumoto et al. | |
| 2008/0192446 A1* | 8/2008 | Hankofer et al. | 361/752 |
| 2008/0218964 A1* | 9/2008 | Chang | 361/687 |
| 2008/0265125 A1 | 10/2008 | Ye et al. | |
| 2008/0291639 A1* | 11/2008 | Li et al. | 361/719 |
| 2008/0296000 A1* | 12/2008 | Lyon | 165/104.33 |
| 2009/0016025 A1* | 1/2009 | Johnson | 361/704 |
| 2009/0080163 A1* | 3/2009 | Lyons | 361/721 |
| 2009/0268421 A1* | 10/2009 | Wu | 361/800 |
| 2010/0061060 A1* | 3/2010 | Tien et al. | 361/697 |
| 2011/0032672 A1* | 2/2011 | Artman et al. | 361/679.47 |
| 2011/0110028 A1* | 5/2011 | Tu et al. | 361/679.33 |
| 2011/0128702 A1* | 6/2011 | Yu | 361/695 |
| 2011/0182035 A1* | 7/2011 | Yajima | 361/717 |
| 2011/0292615 A1* | 12/2011 | Rai et al. | 361/721 |

* cited by examiner

BARRIER DEVICE

CROSS-REFERENCE TO RELATED APPLICATION

This application claims the benefit and priority of Great Britain Application No. GB 1117481.0, filed Oct. 10, 2011. The entire disclosure of the above application is incorporated herein by reference.

FIELD

The invention relates to a barrier device and in particular to a mechanical barrier device for protecting electronic components from air and for guiding airflow.

BACKGROUND

It is normal for some heat to be dissipated by electronic components during use. However, excess heat can be damaging to the electronic components or to the devices in which they are incorporated. It is therefore important to control heat generated by electronic components and to provide adequate cooling to ensure reliable and safe operation of those components.

It is common to use air to cool electronic components. For example, device casings or cabinets which house electronic components can include air cooling devices such as fans. They may also include mechanical features such as ducts or baffles to enable and enhance air flow around the electronic components. This controls the temperature of the electronic components, because heat is convected away by the air.

However, if it is not properly managed, cooling electronic components using air distribution can lead to problems. For example, the air may be contaminated by dust. A product may be installed in an environment which is heavily contaminated by fine dust such as in a paper, textile or ceramic plant. Such dust settling on exposed electronic components and printed circuit boards (PCB's) can interfere with the normal operation of those components and PCB's. Amongst other things, it can result in a reduction in electrical isolation between areas of high electrical potential, and thus may pose a serious safety risk.

In addition, air used to cool electronic components may be contaminated by gases which are corrosive or otherwise harmful to electronic components and PCB's. If a product is used in a polluted environment where such corrosive gases are present, and if it cooled using a fan or other means to blow air through the electronics, the corrosive gas pollution will be drawn into the product and over the electronic components. Areas where there is more air flow will be exposed to a greater level of this pollution. Therefore areas which have a high density of electrical components and thus require significant cooling could be exposed to significant amounts of corrosive gases, which would impair their operation, thus making them less efficient and potentially creating a safety risk.

One known approach for protecting electronic components and PCB's from contaminants such as dust pollution and corrosive gases in cooling air is known as conformal coating. This approach involves applying a coating directly to electronic circuitry to protect it against dust, gases, chemicals, or moisture in air that could affect the performance of the electronic circuitry. Conformal coating can also be used to protect the electronic circuitry from high temperatures that could cause the electronics to be damaged or even to fail completely. Conformal coating can be done by dipping, spraying or brushing the electronic circuits with a suitable material which might be for example a solvent based acrylic. It is possible to selectively conformal or coat particular areas of electronic circuitry within a device, for example in regions where exposure to contaminated air is more likely and/or where there are more likely to be temperature extremes.

It is not always practical to use conformal coating for electronic circuitry. In addition, the process of conformal coating adds to the cost of manufacture and also the time taken to produce electronic circuits for use in devices that make use of air cooling.

No known approach provides reliable protection of electronic circuitry from potential contaminants within cooling air in an efficient, reliable and cost effective manner.

SUMMARY

An invention is set out in the claims.

According to an aspect, an apparatus is provided for protecting an electronic circuit from an airflow, said apparatus comprising a base, wherein said base comprises a cover means for covering at least part of the electronic circuit, said apparatus further comprising a guide means for guiding an airflow around the electronic circuit. The guide means may be a wall, a housing, a baffle, a fin, a duct or any other suitable structure. The apparatus may also comprise a locating means for locating one electronic component in the circuit relative to another component. The apparatus may include openings to allow cooling devices such as heat sinks to emerge therethrough.

According to another aspect an assembly is provided which comprises an apparatus for protecting an electronic circuit from an airflow, said apparatus comprising a base, wherein said base comprises a cover means for covering at least part of the electronic circuit, said apparatus further comprising a guide means for guiding an airflow around the electronic circuit, the assembly further comprising an electronic component. The cover means within the apparatus covers at least part of said electronic component. The electronic component may be provided on a printed circuit board (PCB).

According to another aspect a method is provided of protecting an electronic circuit from an airflow, said method comprising mechanically covering at least part of the electronic circuit and guiding the airflow around the electronic circuit, wherein said covering and guidance steps are both performed by an apparatus which includes a cover means for covering at least a portion of the electronic circuit and a guide means for guiding airflow around the electronic circuit.

Because the apparatus can cover part of the electronic circuit, it can protect it from contamination found in air used to cool the circuit. This includes physical contamination such as dust and chemical contamination such as corrosive gases in the air. The apparatus can enhance the protection of the circuit by helping to guide the air as well. That is, it can deflect the airflow towards or away from selected parts of the circuit, dependent on the sensitivity of its components and on the cooling requirements for the circuit during use. It can be even more useful by helping to locate components relative to one another within the circuit.

Because the apparatus can include openings to allow cooling devices such as heat sinks emerging therethrough, those cooling devices can be exposed to the cooling air without the corresponding electronic components being directly exposed to the air. As a result, the apparatus allows sensitive electronic components within the circuit that require cooling to be cooled without being contaminated.

DRAWINGS

Embodiments and examples will now be described with respect to the appended figures of which:

OVERVIEW

In overview, an apparatus is provided for protecting electronic circuitry from potentially contaminated air. In addition to providing that protection, the apparatus can manipulate air flow around the circuitry and/or can provide a mechanical connection between or location of cooling devices such as heat sinks and the electronic circuitry.

The apparatus generally comprises a device that can be fitted around, over and/or in between electronic components which are to be protected. The physical configuration of the barrier is selected so as to act as a mechanical shield which protects selected electronic components, for example the sensitive areas on an electronic PCB assembly, to ensure that physical contaminants within air such as dust particles cannot settle on those areas. This reduces the chance of electrical failure of those due to physical (dust) contamination.

The mechanical barrier device also provides protection of electronic circuitry against chemical contamination from cooling air. This is achieved by the physical configuration of the mechanical barrier device being designed and manufactured so as to act as a blockade and thus prevent polluted air from blowing directly over sensitive electronic components. For example it can be arranged to prevent polluted air from blowing directly over the surface of a PCB and sensitive components thereon, thereby minimising potential damage to corrosion.

The mechanical barrier device allows an electronic circuit to be cooled by air whilst at the same time protecting that circuit from both physical and chemical contamination. It can do this by including gaps or air holes at select locations, if the components at those locations are not particularly sensitive to contamination, to allow air to directly touch those locations. Alternatively or additionally, openings can be included to allow cooling devices such as heat sinks to protrude therethrough, wherein those cooling devices extend from electronic components that require cooling but are potentially sensitive to contamination. The cooling devices are air cooled, instead of directly cooling the sensitive electronic component(s). As a result, air can still flow around or through areas of the electronic circuitry, or to cooling devices connected thereto, in order to cool the electric components during operation but at the same time not causing physical or chemical contamination to the circuit.

The mechanical barrier device can include walls which provide electrical and/or thermal isolation between circuit components. It can also include holes or recesses which components can fit into or through. It can thus act as a locating means for those components, and can mechanically link them to other features such as a PCB.

DETAILED DESCRIPTION

Figure 1:
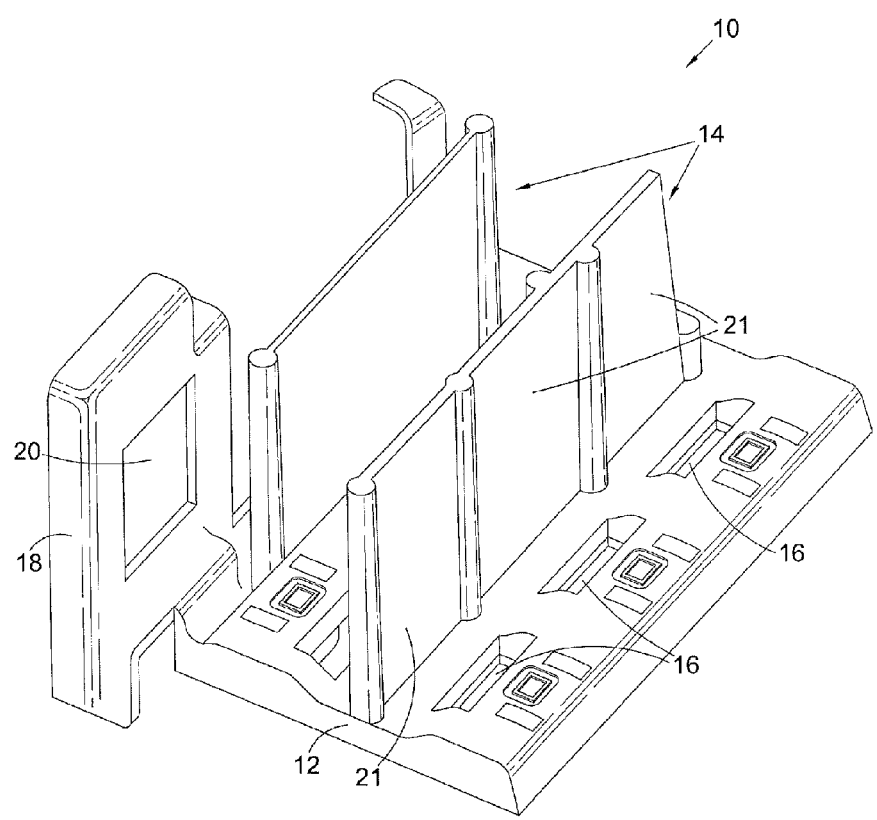
FIG. 1 shows a mechanical barrier device.

FIG. 1 shows an example of a mechanical barrier device. The device 10 is moulded from a suitable material such as a heat resistant plastic. It may be formed from a fire-retardant Poly Carbonate or from a similar resin. It includes a base 12, a number of walls 14 extending upwards substantially perpendicular to the base 12, a plurality of openings 16 in the base 12 and a housing 18 also extending upwards substantially perpendicular to the base 12 and including a cut out portion 20.

Figure 2:
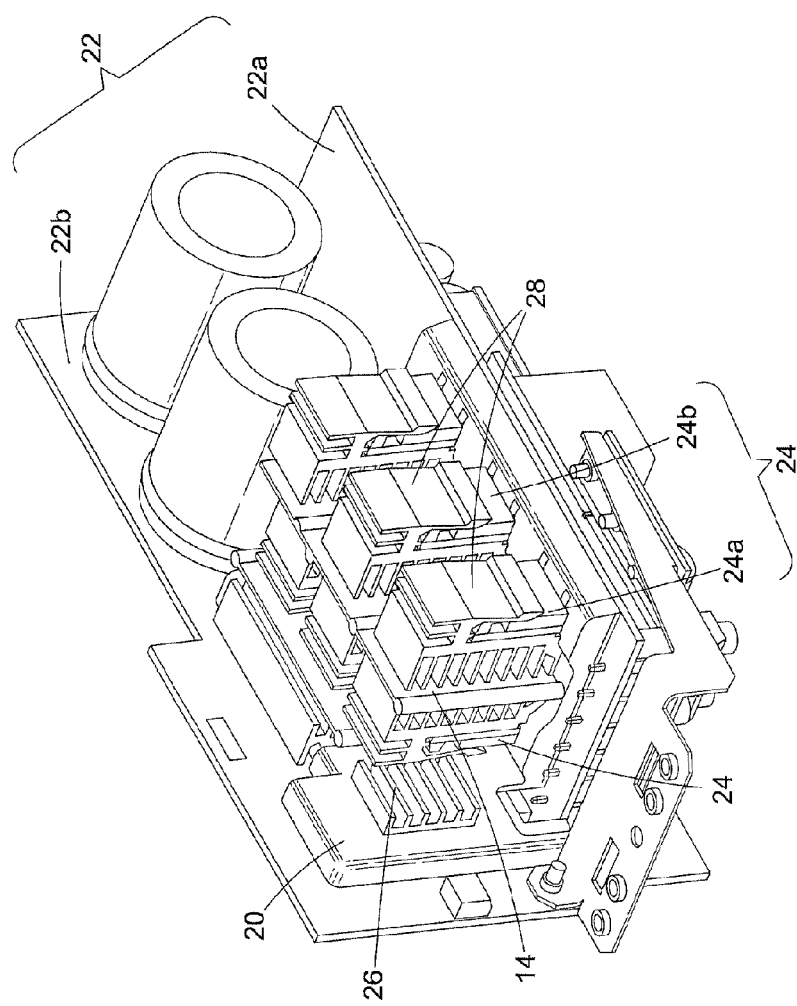
FIG. 2 shows the mechanical barrier device of FIG. 1 in use in conjunction with electronic circuitry.

The operation of the device 10 can be better understood with respect to FIG. 2. As shown therein, the device 10 can be fitted over electronic components which are electrically connected to another and/or to one more PCB's 22. As discussed further below, the exact physical features of the device 10 can be selected to work in conjunction with a wide range of different electronic circuits.

In the example depicted in FIGS. 1 and 2 herein, the device 10 is used in conjunction with two PCB's 22 which are connected together substantially at a right angle. A first plurality of electric components 24 is provided on the first PCB 22a, wherein some of those components 24 have respective heat exchangers or heat sinks 28 connected to them. The heat sinks 28 extend substantially upwards from the horizontal PCB 22a as shown in FIG. 2. A second electric component or plurality components 26 is provided on the second PCB 22b, again with one or more heat sinks 28 connected thereto, extending outwardly from the substantially vertical PCB 22b.

In this case therefore, the openings 16 in the base of the device 10 enable a first plurality of components 24, and/or the heat sinks 28 to which they connect, to project substantially vertically upwards from the first PCB 22a. Those components 24 and/or heat sinks 28 project through and above the base 12 of the device 10, without the device 10 causing any physical impediment to them. Similarly, the housing 18 which projects substantially vertically upwards from the base 12 of the device 10 can allow the second component(s) 26, or the heat sink(s) 28 connected thereto, to project outwards without causing any physical impediment or restriction.

The operation of the heat sinks 28 shown in FIG. 2 will be apparent to the skilled reader. The function of a heat sink 28 is to conduct heat away from an electrical component to which it connects, into the heat sink 28. Fins or other spaced projections extend from the man body of heat sink 28, wherein the gaps between those fins enable air flow therethrough. This carries heat away from the heat sink 28, thereby cooling the electrical component to which it connects. Therefore, if there is a sensitive electrical component within a circuit that needs to be protected from contamination, but also needs to be cooled during operation, a heat sink 28 can be connected to that component. The heat blocks the sensitive electrical component from contacting the air and the device 10 described herein can be designed to include an opening or recess to accommodate the heat sink 28. The heat sink 28 can protrude through the device and can be air cooled normally, without risk of contaminating the sensitive electrical component beneath.

The device 10 can help to locate one or more heat sinks 28 with respect one another or with respect to the electrical components that are to be cooled. For example, one of the walls 14 of the device 10 in FIG. 1 includes thickened portions which define channels 21 along the faces of the wall 14, wherein those channels 21 correspond in size and shape to individual heat sinks 28. This helps to locate the heat sinks 28 and maintain them in the correct physical position with respect to one another and with respect to the electrical circuit that is being cooled and protected.

Except for the openings 16 described above, the base 12 of the device 10 forms a substantially continuous cover over a portion of the first PCB 22a. Therefore it acts a mechanical barrier between the air and that portion of the first PCB 22a.

Similarly, the housing 18 forms a substantially continuous cover over a portion of the second PCB 22b, except for the cut out portion 20 which enables electronic components 26 and/or heat sinks 28 to project therethrough. This means that the device 10 protects those areas of the PCB's 22 from physical contamination due to dust or other particles in cooling air passed over the circuit, and also from any chemical contaminants or moisture which may be present in that air, that could be potentially damaging. But it still allows the circuit to be cooled, via heat sinks or other appropriate cooling devices physically connected to the circuit and exposed to the cooling air. The device can be specifically designed and manufactured so that any components which require cooling can have cooling devices attached thereto whereas other components which do not dissipate enough energy during operation to require cooling are simply covered by the device 10, and thereby are protected from contaminants in the cooling air.

In the embodiment shown in FIGS. 1 and 2, the first wall 14 of the device 10 is located between two parallel rows of electrical components 24 which have respective heat sinks 28 attached thereto. The second wall 14 is positioned behind the second row of components 24 and heat sinks 28. The walls 14 therefore act as protective barriers for the components 24, blocking the flow of air between the two rows of components. In addition to providing a physical and thermal barrier, the walls 14 can operate as an electrical clearance barrier. They provide an electrical barrier between components which are at high electrical potential, thereby improving the reliability of the circuit.

In practice, the device 10 can be placed on or over a PCB 22 before the electrical components 24, 26 and/or before the heat sinks 28 are connected thereto. The device 10 itself may be mechanically connected to the PCB 22 by a snap fit, by an interaction between a projection on the PCB 22 and a recess on the device 10, or by any other suitable means. Alternatively the device 10 may simply be placed on or over the PCB 22 and the physical connection of the electrical components, 24, 26, or heat sinks 28 to the PCB 22, through the device 10, secures the device 10 in place.

The device 10 shown in FIG. 1 is suitable for the particular configuration of electrical components and heat sinks shown in FIG. 2. However the device 10 may be designed and manufactured to work in conjunction with any combination of electrical components, cooling devices and PCB's. The design considerations for the device 10 can include:

providing protection of sensitive electrical components against dust pollution or other physical contamination;
  providing protection of sensitive electrical components against corrosive gases or other chemical contamination or from moisture;
  providing an electrical clearance barrier between components of high electrical potential;
  providing ducting to control the distribution of cooling air around some or all of the electrical components;
  locating electrical components and/or heat exchange devices relative to one another and/or relative to a PCB;
  covering electrical components which are sensitive to contamination and which do not require cooling;
  allowing electrical components which are sensitive to contamination but require cooling to be connected to cooling devices; and
  providing a thermal barrier between heat exchange devices and/or between electrical components.

The ducting can be provided by structures such as walls, fins, baffles, channels, ducts or other barriers to prevent or deflect the flow of air around or over particular electrical components. These structures can also guide the airflow in order to focus cooling on areas of the circuit which get particularly hot during use. In addition or alternatively, the device may include the provision of vents, holes, or cut outs to specifically enable air flow on or around certain electrical components.

The physical configuration of the device can be sized and shaped so as to fit comfortably with the electrical components that are to be protected, without changing or impairing their location or relative positioning, and without affecting their electrical operation. As described above, the device 10 can also include openings which enable electrical components to be connected to one another, to cooling devices, and/or to a PCB via the device 10. |It can also comprise channels or other guide means for guiding the location or separation of electrical components or of heat exchange devices.

It is possible to design and manufacture a suitable mechanical barrier device 10 for any electrical components or circuits. A single mechanical barrier device 10 may be suitable for use with a number of different types of electrical components and different circuit arrangements. When designing the device 10, the effects of air flow and temperature control should be considered. Often it will be necessary to consider the particular location or position in which a circuit will be placed, including the relative position of any fans or air cooling devices that are intended for use in cooling the circuit, before designing the physical configuration of the device 10. The sensitivity of individual electrical components should also be considered, to decide which components or regions of components should be protected, as well as considering where, if anywhere, an electrical clearance barrier or thermal barrier should be provided by the device 10. Additionally it should be considered whether any heat sinks or other cooling devices are to be used with the electrical components and whether it is desirable or necessary to guide or support those devices (or any of the electrical components themselves) using a suitable opening, wall, channel, housing or projection within the device. If possible, it is also useful to consider the environment in which the circuit is to be placed to assess the potential extent of physical and/or chemical contamination within the cooling air that will be used to cool the circuit before deciding which parts of the circuit to protect using the device 10.

Known approaches exist for predicting the effects of air flow and temperature control on electrical circuits. For example, FloTHERM® distributed by 'Mentor Graphics' is a powerful 3D Computational Fluid Dynamics (CFD) software that predicts airflow and heat transfer in and around electronic equipment, from components and boards up to complete systems. It or similar software can be used to perform thermal analysis for electronics cooling, which can be used in the design of the mechanical barrier device 10.

The mechanical barrier device 10 can be manufactured by moulding using an injection moulding or compression moulding tool. The device 10 can be created as a single integral structure. Alternatively, it possible to manufacture individual parts of the device—such as base sections, walls and housings—separately and fit them together in an appropriate manner for use with a desired circuit at a particular time.

The use of a mechanical barrier device 10 for protecting electrical components has many advantages over prior art approaches, which rely for the most part on applying chemical barriers directly to electrical components. The device can both protect an electrical circuit from contaminated air and at the same time manipulate the flow of that air. So it can provide complete barriers to prevent air flow in some locations on an electrical circuit and can at other locations allow some air flow. It can also cool heat exchangers or other cooling devices connected to electrical components which themselves are physically covered. Therefore it enables thermal cooling of the circuitry, but at the same time provides a shield to stop that air touching (and thereby compromising the operation of) sensitive electrical components.

The device can protect electrical components from dust pollution, chemical pollution including that caused by corrosive gases in air, and can also protect against any negative effect of moisture in the air. By enabling air flow around or over part of the circuit, or at least to cooling devices connected to the circuit, the device enables efficient thermal performance of the circuit, and ensures that it will not overheat. It allows the user to continue making use of air cooling, which is a relatively cost-effective and easy to implement cooling method for electrical circuitry, without that air compromising the operation of the circuit, even in polluted environments.

In addition to contamination protection and air flow manipulation, the device can provide electrical isolation at appropriate points in a circuit. Therefore it enhances the overall safety of the circuit. It can also serve as a mechanical guide, support or locating means for electrical components and/or heat sinks. So it helps to make the circuit mechanically sturdy and reliable—again enhancing safety and also reducing wear and tear.

Whilst a particular example of a mechanical barrier device and associated electrical circuit has been shown and described above, the skilled reader will appreciate that variations have also been described. Further variations may be made without departing from the inventive concepts described herein. As detailed above, the mechanical barrier device can be specifically designed to work in conjunction with any array of electrical components, taking into account the extent to which those components must be protected, their physical features and positions, and the effect of flow and temperature control in and around the circuit.

The invention claimed is:

1. An apparatus for protecting one or more electrical components of an electronic circuit from an airflow, said apparatus comprising a base, wherein said base comprises a cover for covering at least part of the one or more electrical components, and wherein said base includes at least one opening arranged to allow a cooling device to protrude at least partially therethrough, said apparatus further comprising a guide for guiding an airflow to the cooling device.

2. An apparatus as claimed in claim 1 wherein said guide comprises at least one wall projecting from said base.

3. An apparatus as claimed in claim 2 wherein said wall includes a locating means for locating a first electronic circuit component relative to a second electronic circuit component.

4. An apparatus as claimed in claim 3 wherein at least one of the first electronic circuit component and the second electronic circuit component is connected to a respective heat sink, and wherein said locating means is arranged to separate said heat sink from another heat sink or from the other respective electronic circuit component.

5. An apparatus as claimed in claim 1 further comprising a housing projecting from said base for surrounding at least part of: an electronic component and/or a heat sink.

6. An apparatus as claimed in claim 5 wherein said housing includes an opening to allow at least part of the electronic component or heat sink to protrude therethrough.

7. An apparatus as claimed in claim 1 wherein said guide comprises a baffle, a barrier, a channel, a duct or a fin for blocking or deflecting an airflow.

8. An apparatus as claimed in claim 1 wherein the at least one opening is arranged to allow an electronic component of the one or more electrical components to protrude at least partially therethrough.

9. An apparatus as claimed in claim 8 comprising first and second openings for locating first and second respective electronic components relative to one another.

10. An apparatus as claimed in claim 8 wherein said opening is arranged to allow an electronic component of the one or more electrical components or the cooling device to protrude therethrough for mechanical connection to a printed circuit board (PCB).

11. An apparatus as claimed in claim 9 further comprising a barrier arranged to provide an electrical clearance barrier and/or a thermal barrier between first and second electronic components.

12. An assembly comprising an apparatus as claimed in claim 1 and the one or more electronic components, wherein the cover within the apparatus covers at least part of the one or more electronic components.

13. An assembly comprising an apparatus as claimed in claim 1 and a PCB connected thereto, said PCB having a surface with an electronic component disposed thereon, wherein the cover within the apparatus covers at least part of said electronic component.

14. An assembly as claimed in claim 13 wherein the apparatus includes an opening and wherein a connector projects from the PCB, through said opening, to form a mechanical connection between the apparatus and the PCB.

15. An assembly as claimed in claim 12 wherein at least one of said one or more electronic components is connected to the cooling device.

16. A method of protecting one or more electrical components of an electronic circuit from an airflow, said method comprising:
mechanically covering at least part of the one or more electrical components; and
guiding the airflow to a cooling device;
wherein said covering and guidance steps are both performed by an apparatus which includes a base having at least one opening arranged to allow the cooling device to protrude at least partially therethrough, said base comprising a cover for covering at least a portion of the one or more electrical components and a guide for guiding airflow to the cooling device.

17. A method of protecting an electronic circuit from an airflow as claimed in claim 16, wherein the apparatus performing said steps is part of an assembly comprising one or more electronic components, wherein the cover of the apparatus covers at least part of said one or more electronic components.

18. An apparatus as claimed in claim 1 wherein the cooling device is a heat sink.

19. An apparatus comprising:
one or more electrical components;
a base including a cover covering at least part of the one or more electrical components, the base defining at least one opening;
a cooling device protruding at least partially through the at least one opening; and
a guide for guiding an airflow to the cooling device.

20. The apparatus as claimed in claim 19, wherein said guide comprises at least one wall projecting from said base.

* * * * *